(12) United States Patent
Derai et al.

(10) Patent No.: US 12,211,763 B2
(45) Date of Patent: Jan. 28, 2025

(54) ENHANCED THERMAL DISSIPATION IN FLIP-CHIP SEMICONDUCTOR DEVICES USING LASER DIRECT STRUCTURING (LDS) TECHNOLOGY

(71) Applicant: STMicroelectronics S.r.l., Agrate Brianza (IT)

(72) Inventors: Michele Derai, Milan (IT); Dario Vitello, Merate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 421 days.

(21) Appl. No.: 17/549,058

(22) Filed: Dec. 13, 2021

(65) Prior Publication Data

US 2022/0199477 A1   Jun. 23, 2022

(30) Foreign Application Priority Data

Dec. 17, 2020   (IT) .................. 102020000031244

(51) Int. Cl.
| | |
|---|---|
| *H01L 23/29* | (2006.01) |
| *H01L 21/48* | (2006.01) |
| *H01L 23/31* | (2006.01) |
| *H01L 23/495* | (2006.01) |

(52) U.S. Cl.
CPC .......... *H01L 23/29* (2013.01); *H01L 21/4821* (2013.01); *H01L 23/31* (2013.01); *H01L 23/495* (2013.01)

(58) Field of Classification Search
CPC .... H01L 23/29; H01L 21/4821; H01L 23/495
USPC ........................................................ 257/666
See application file for complete search history.

(56) References Cited

U.S. PATENT DOCUMENTS

| | | | |
|---|---|---|---|
| 2006/0214308 A1 | 9/2006 | Yu et al. | |
| 2013/0341780 A1* | 12/2013 | Scharf | ............... H01L 24/24 |
| | | | 257/E21.507 |
| 2019/0115287 A1 | 4/2019 | Derai et al. | |

FOREIGN PATENT DOCUMENTS

| | | |
|---|---|---|
| DE | 102019115369 A1 | 12/2020 |
| WO | 2020038554 A1 | 2/2020 |

OTHER PUBLICATIONS

IT Search Report and Written Opinion for priority application, IT 102020000031244, report dated Sep. 7, 2021, 8 pages.

* cited by examiner

*Primary Examiner* — Quoc D Hoang
(74) *Attorney, Agent, or Firm* — Crowe & Dunlevy LLC

(57) ABSTRACT

A method of manufacturing semiconductor devices, such as QFN/BGA flip-chip type packages, arranging on a leadframe one or more semiconductor chips or dice having a first side facing towards the leadframe and electrically coupled therewith and a second side facing away from the leadframe. The method also includes molding an encapsulation on the semiconductor chip(s) arranged on the leadframe, where the encapsulation has an outer surface opposite the leadframe and comprises laser direct structuring (LDS) material. Laser direct structuring processing is applied to the LDS material of the encapsulation to provide metal vias between the outer surface of the encapsulation and the second side of the semiconductor chip(s) and as well as a metal pad at the outer surface of the encapsulation.

13 Claims, 5 Drawing Sheets

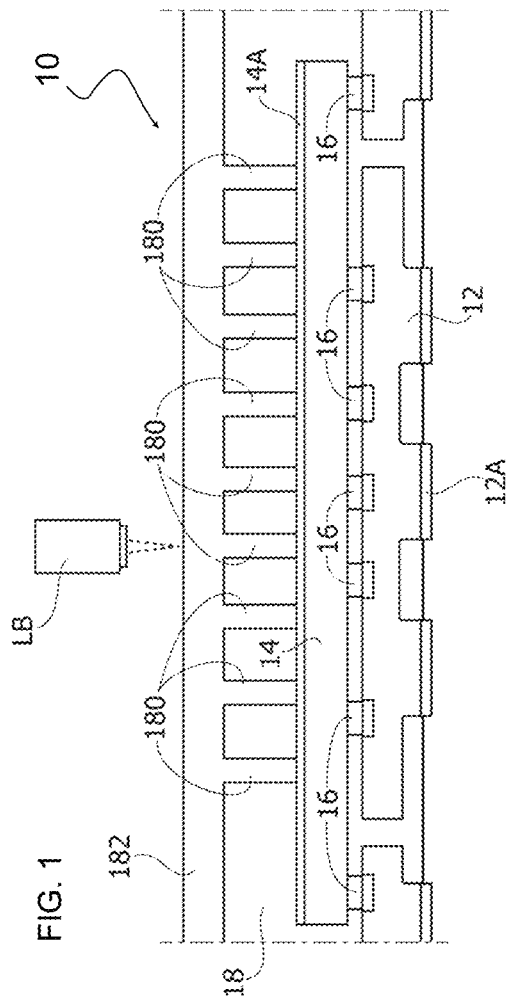
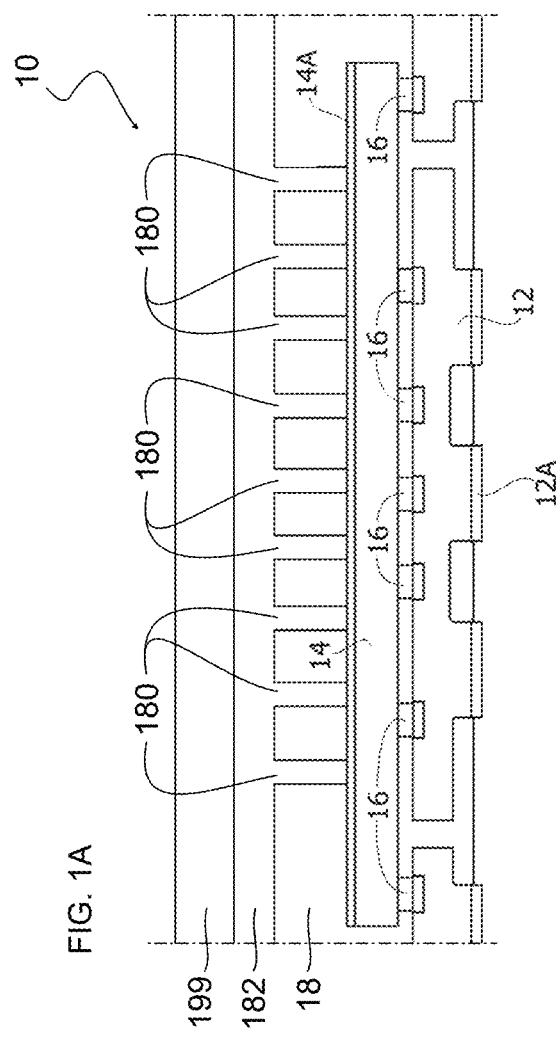

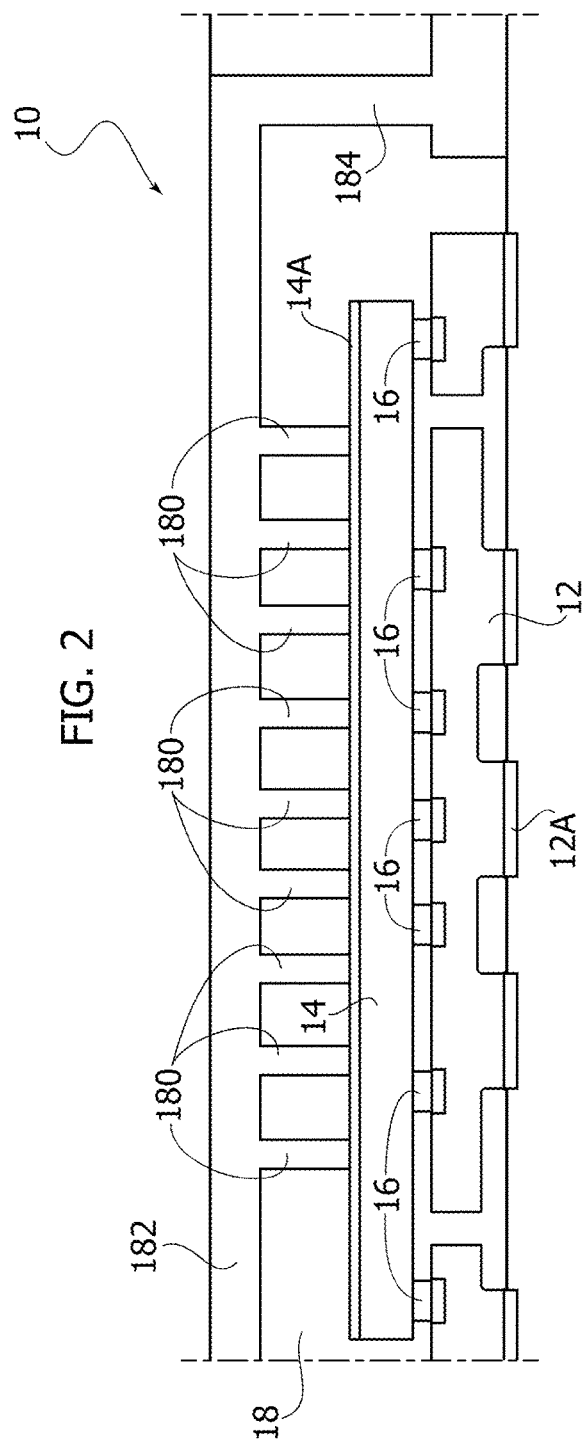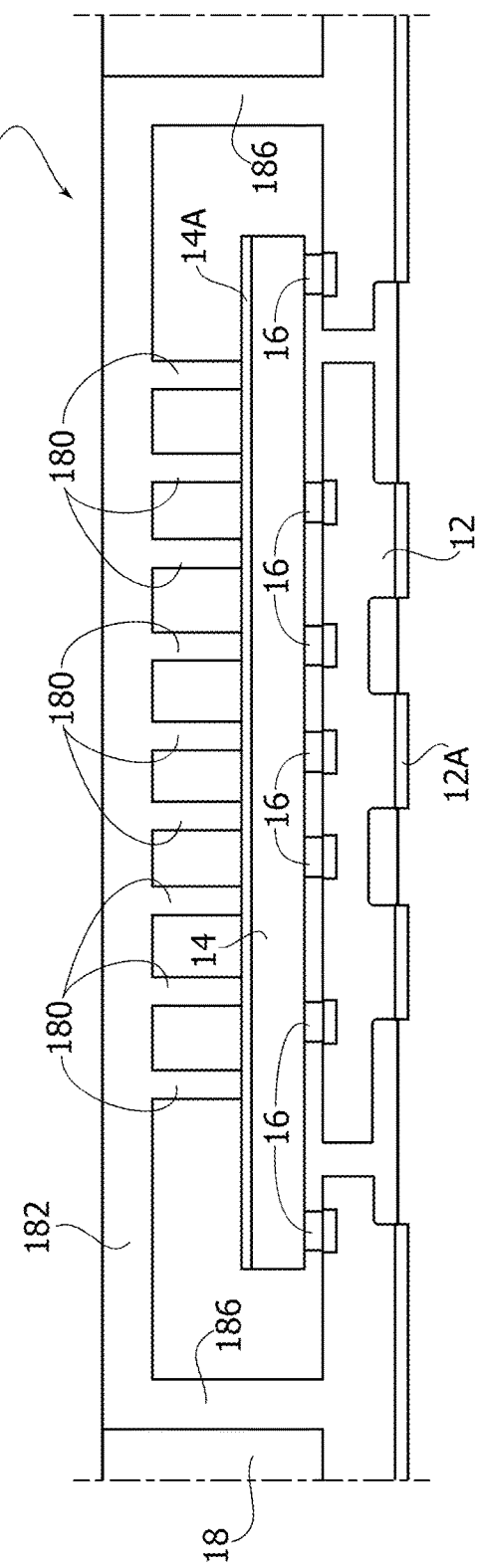

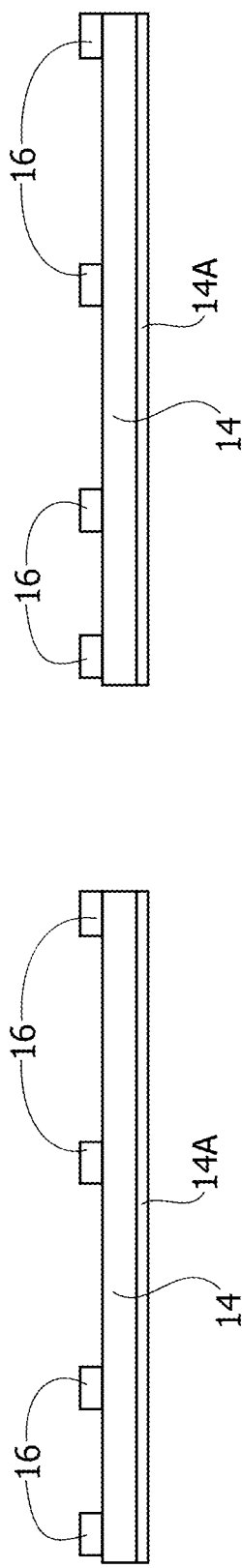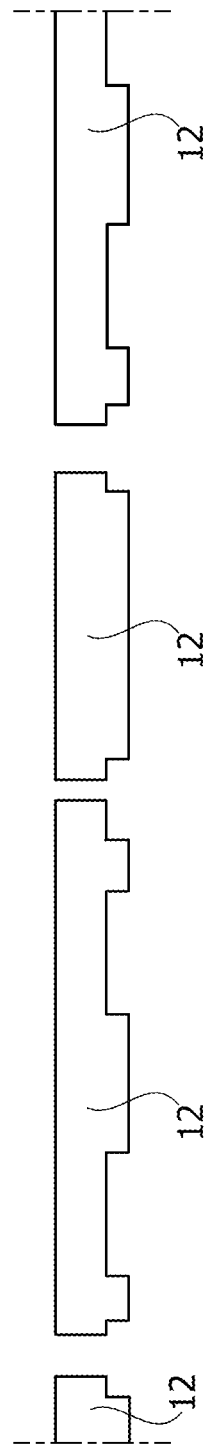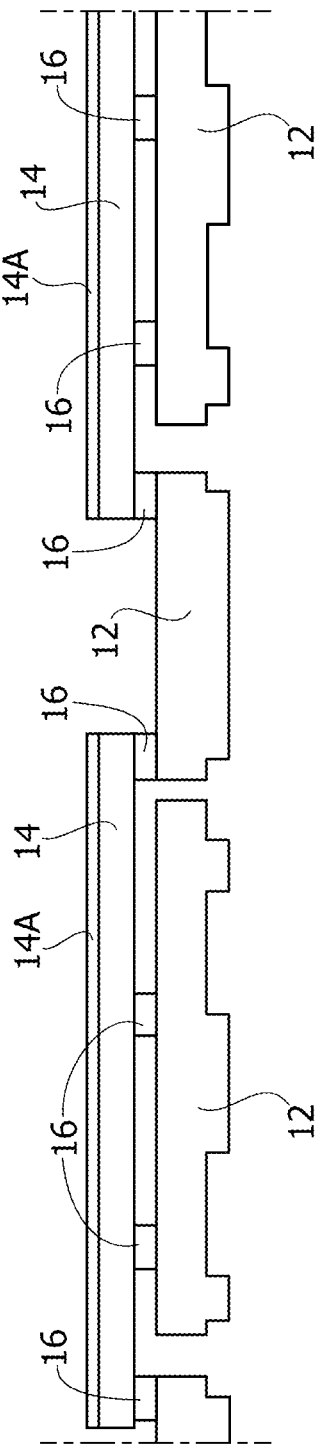

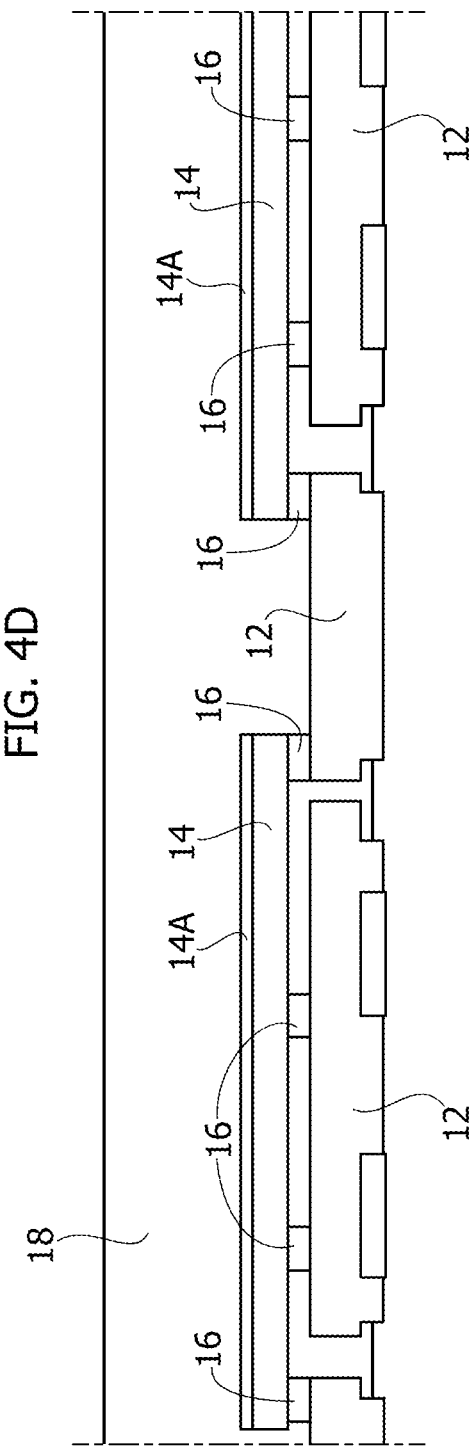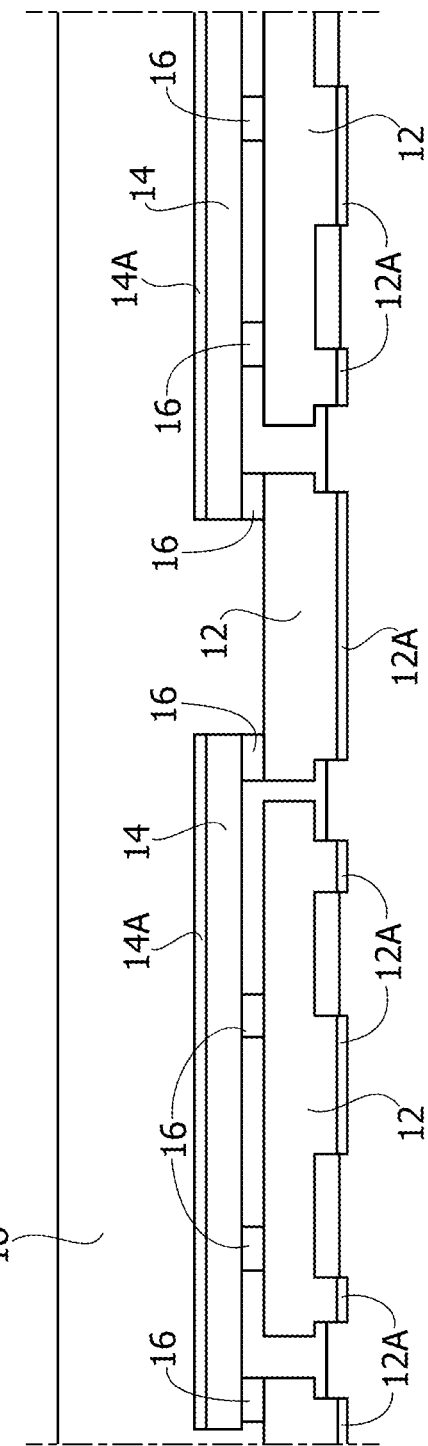

ENHANCED THERMAL DISSIPATION IN FLIP-CHIP SEMICONDUCTOR DEVICES USING LASER DIRECT STRUCTURING (LDS) TECHNOLOGY

PRIORITY CLAIM

This application claims the priority benefit of Italian Application for Patent No. 102020000031244, filed on Dec. 17, 2020, the content of which is hereby incorporated by reference in its entirety to the maximum extent allowable by law.

TECHNICAL FIELD

The description relates to semiconductor devices. In particular, one or more embodiments may be applied to semiconductor devices such as integrated circuits (ICs).

BACKGROUND

Semiconductor devices such as, for instance, Quad Flat No-leads (QFN) packages having peripheral lands at the package bottom in order to provide electrical connection via flip-chip mounting on a substrate, such as a printed circuit board (PCB), stimulate an ever-increasing interest for various applications.

Good heat dissipation facilitates adequate performance of these devices. An exposed pad is now conventionally used in standard QFN packages in order to increase thermal dissipation.

However, it is observed that such an approach may suffer from various reliability issues related to power dissipation. This is found to be particularly the case for flip-chip type semiconductor devices.

There is a need in the art to contribute in providing improved approaches overcoming these drawbacks.

SUMMARY

One or more embodiments may relate to a method.

One or more embodiments may relate to a corresponding semiconductor device.

One or more embodiments involve molding a die/dice and a leadframe in the device with laser-direct-structuring (LDS) material (a molding compound with a chromium oxide particle filler, for instance).

One or more embodiments benefit from the proven capability of laser-direct-structuring (LDS) technology to form vias and tracks.

One or more embodiments may exhibit detectable metal (e.g., copper) filled vias and a heat spreader molding compound (with chromium oxide particles).

One or more embodiments may facilitate high thermal dissipation from semiconductor devices, possibly via dual-side dissipation.

One or more embodiments are compatible for use in those devices that benefit from good thermal dissipation, for instance in a flip-chip version.

For instance, this may be the case in power devices where full exploitation of package leads as input/output (I/O) nodes is a desirable feature, with heat dissipation entrusted primarily to backside semiconductor material (silicon) through a top exposed pad.

One or more embodiments benefit from a top thermal pad created through LDS activation and metal (e.g., Cu) plating, which provides improved thermal dissipation in comparison with standard flip-chip solutions.

BRIEF DESCRIPTION OF THE DRAWINGS

One or more embodiments will now be described, by way of example only, with reference to the annexed figures, wherein:

FIG. 1 is a cross-sectional view of a semiconductor device as per embodiments of the present description;

FIG. 1A is a cross-sectional view of a semiconductor device as per embodiments of the present description;

FIGS. 2 and 3 are cross-sectional views of a semiconductor device illustrative of possible options in implementing embodiments of the present description; and FIGS. 4A to 4G are illustrative of a possible assembly flow in forming embodiments of the present description.

Figure 4F:
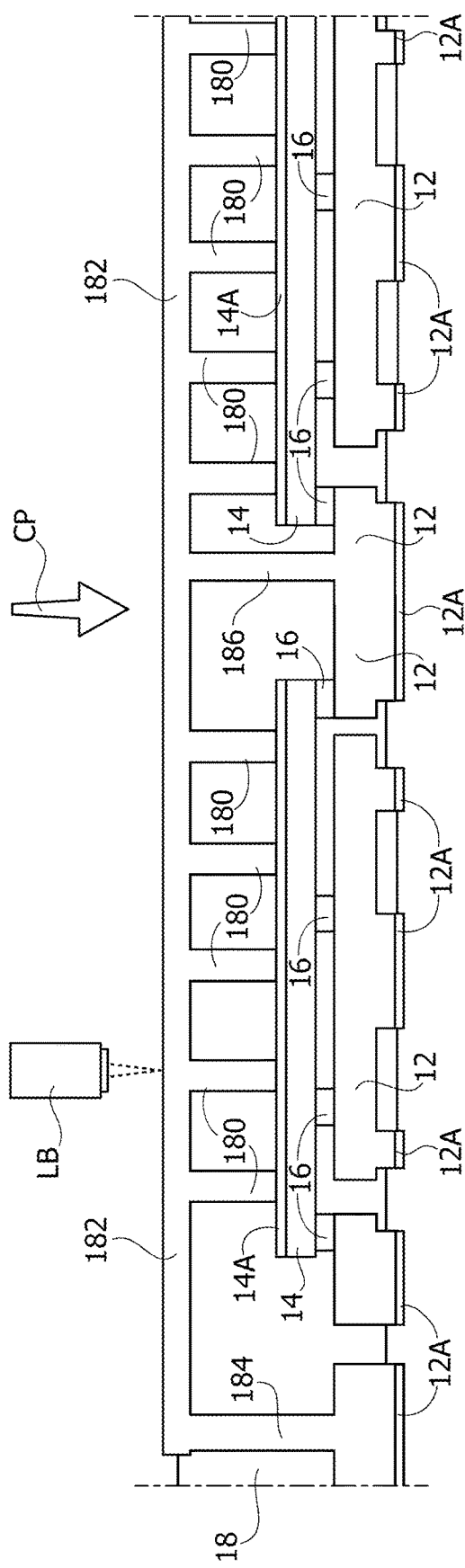

It will be appreciated that, for the sake of clarity and ease of understanding, the various figures may not be drawn to a same scale.

DETAILED DESCRIPTION

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular conformations, structures, or characteristics may be combined in any adequate way in one or more embodiments.

The headings/references used herein are provided merely for convenience and hence do not define the extent of protection or the scope of the embodiments.

Also, throughout the figures, unless the context indicates otherwise, like parts or elements are indicated with like reference symbols, and a corresponding description will not be repeated for each and every figure for brevity.

Various types of conventional semiconductor devices comprise a leadframe on which one or more semiconductor chips or dice are mounted.

The designation leadframe (or lead frame) is currently used to indicate a metal frame which provides support for a semiconductor chip or die as well as electrical leads to couple the semiconductor chip or die to other electrical components or contacts.

Essentially, a leadframe comprises an array of electrically-conductive formations (leads) which from a peripheral location extend inwardly in the direction of the semiconductor chip or die, thus forming an array of electrically-conductive formations from the die pad having at least one semiconductor chip or die attached thereon. This may be via a die attach adhesive (a die-attach film or DAF, for instance).

Electrical coupling of the leads in the lead frame with the semiconductor chip or die may be via wires forming a wire-bonding pattern around the chip or die.

The device package is completed by an insulating encapsulation formed by molding a compound such as an epoxy resin on the leadframe and the semiconductor chip(s) attached thereon.

Semiconductor devices of the Quad Flat No-leads (QFN) type may resort to a ball-grid array (BGA) for electrical connection to external circuitry (a printed circuit board or PCB, for instance), The resulting arrangement is referred to as a QFN/BGA arrangement.

In conventional QFN/BGA arrangements, where semiconductor chip(s) mounted on a leadframe have pads at their top or front surface connected to the leadframe via a wire bonding pattern, an exposed die pad can be provided in order to facilitate thermal dissipation.

Semiconductor devices of the so-called flip-chip type include interconnections to external circuitry via solder bumps deposited on chip pads formed at the top or front side of the semiconductor chip or die. The chip is coupled to external circuitry (a printed circuit board or PCB, for instance) by flipping it over so that its front side faces downwards. The pads at that surface are aligned with corresponding pads on the external circuit (PCB, for instance). Solder reflow completes the interconnection.

As a result, in conventional semiconductor devices of the flip-chip type (which may otherwise adopt a QFN/BGA configuration) the semiconductor chips are usually mounted in the package turned upside down (bottom side up and top side down). Thermal dissipation from the device is inevitably poor insofar as bottom or back side of the die or chip is not in contact with a metal plate, with heat dissipation occurring only through metal (e.g., Cu) pillars, with the die area coupled to the leadframe for heat transfer being small so the thermal dissipation performance of the device is poor.

For that reason, flip-chip packages are used primarily for devices with (very) low thermal dissipation being expected and/or those applications where reduced thermal dissipation in not regarded as a critical feature.

One or more embodiments may take advantage from laser direct structuring technology applied to manufacturing semiconductor devices.

Laser direct structuring (LDS) is a technology adopted in various areas which may involve molding (injection molding, for instance) of resins containing additives.

A laser beam can be applied to the surface of a molded part in order to transfer thereto a desired pattern. A metallization process such as an electro-less plating process, involving metals such as copper can then be used to plate a desired conductive pattern on the laser-activated surface. LDS processing is also known to be suited for providing vias or contact pads.

FIG. 1 is illustrative of semiconductor device 10 which can be manufactured in accordance with embodiments as described herein.

As otherwise conventional in the art, a device such as the semiconductor device 10 can be manufactured as a part of an array (a string or strip, for instance) of similar devices which are finally separated via "singulation". The figures are illustrative of steps applied in order to produce one such device. It will be otherwise understood that these steps can be applied to fabricating plural devices 10 simultaneously.

A semiconductor device 10 as illustrated in FIG. 1 comprises a leadframe 12 on which one or more semiconductor chips or dice 14 are mounted: a single chip or die 14 is illustrated here for simplicity.

The leadframe 12 may be of the pre-molded type with an insulating compound molded on a basic metal structure of the leadframe etched out of a metal (e.g., copper) strip or reel.

The leadframe 12 may be plated at its bottom or back surface as shown at 12A.

Mounting of the chip or die 14 on the leadframe 12 may be via bumps 16, with the chip or die turned upside down (referred to in the art as "flip-chip"), that is with its bottom or back side (possibly metallized at 14A) facing upwards and its top or front side facing downwards.

An encapsulation 18 can be molded on the leadframe 12 and the semiconductor chip(s) 14 attached thereon.

In one or more embodiments, the encapsulation 18 is provided using laser direct structuring (LDS) material.

This material may include, for instance, a thermoplastic material, doped with a compound which can be activated by a laser. Subsequent metallization, for instance in an electroless copper bath with layers of copper, nickel, and gold finish formed thereon facilitates providing electrically-conductive formations at the locations where the LDS material was laser-activated. LDS technology has proved to be suited for use in providing vias or contact pads.

FIG. 1 is illustrative of a device 10 where an LDS molding compound 18 can be molded on a die 14 with backside metallization 14A.

Laser beam energy as exemplified at LB and LDS processing can be applied to form one or more (electrically- and thermally-conductive) metallized vias 180 extending through the molding compound down to the (bottom or back metallization 14A of the) die 14 and to structure a thermal pad 182 on the top of the package of the device 10.

For instance, electroless plating and galvanic Cu plating facilitate growing a thermal pad 182 on top of the package, creating a connection with external world for thermal dissipation. For instance, an additional heat sink (shown in FIG. 1A) can be added on top of the thermal pad 182.

FIGS. 2 and 3 are illustrative of different options in implementing an arrangement as illustrated in FIG. 1.

Unless the context indicates otherwise, in FIGS. 2 and 3 parts or elements like parts or elements already discussed in connection with FIG. 1 are indicated with like reference symbols so that a corresponding description will not be repeated for brevity.

As illustrated in FIG. 2, a sacrificial via 184 (to be removed during a final singulation step) can be provided on external rail to allow current continuity to the top exposed pad 182 and a thick copper growth on top of the thermal pad 182.

As illustrated in FIG. 3, some leads in the leadframe 12 can be used to connect through vias 186 the top exposed pad 182 again allowing thick copper growth on top of the thermal pad 182.

FIGS. 4A to 4G are illustrative of a possible assembly flow in embodiments of the present description.

Those of skill in the art will otherwise appreciate that certain steps as exemplified in FIGS. 4A to 4G may be omitted or replaced by other steps or other steps may be added. Also, one or more steps in the process may be performed in an order different from the order exemplified in FIGS. 4A to 4G.

FIG. 4A is exemplary of pillars 16 (e.g., copper) being grown on (the front or top surface of) semiconductor chips or dice 14 metallized at 14A at their bottom or back side.

FIG. 4B is exemplary of a leadframe 12 being provided on which the semiconductor chips or dice 14 are attached (turned upside down) as exemplified in FIG. 4C.

FIG. 4D is exemplary of a step where (for instance after reflow and flux cleaning) a LDS molding compound 18—that is, a molding compound comprising laser-activatable material as used in LDS technology—is molded on the structure illustrated in FIG. 4C.

These steps can be performed in any suitable way, as will be appreciated by those of skill in the art.

After possible plating (e.g., tin plating) at 12A as illustrated in FIG. 4E (if no pre-plated LF is available), LDS processing is applied to the molding compound 18 as illustrated in FIG. 4F.

As illustrated in FIG. 4F, LDS processing of the molding compound 18 may comprise laser activation as exemplified at LB and metallization (electroless and galvanic Cu plating for instance) in order to form the vias 180 and the exposed pad 182.

Figure 4G:
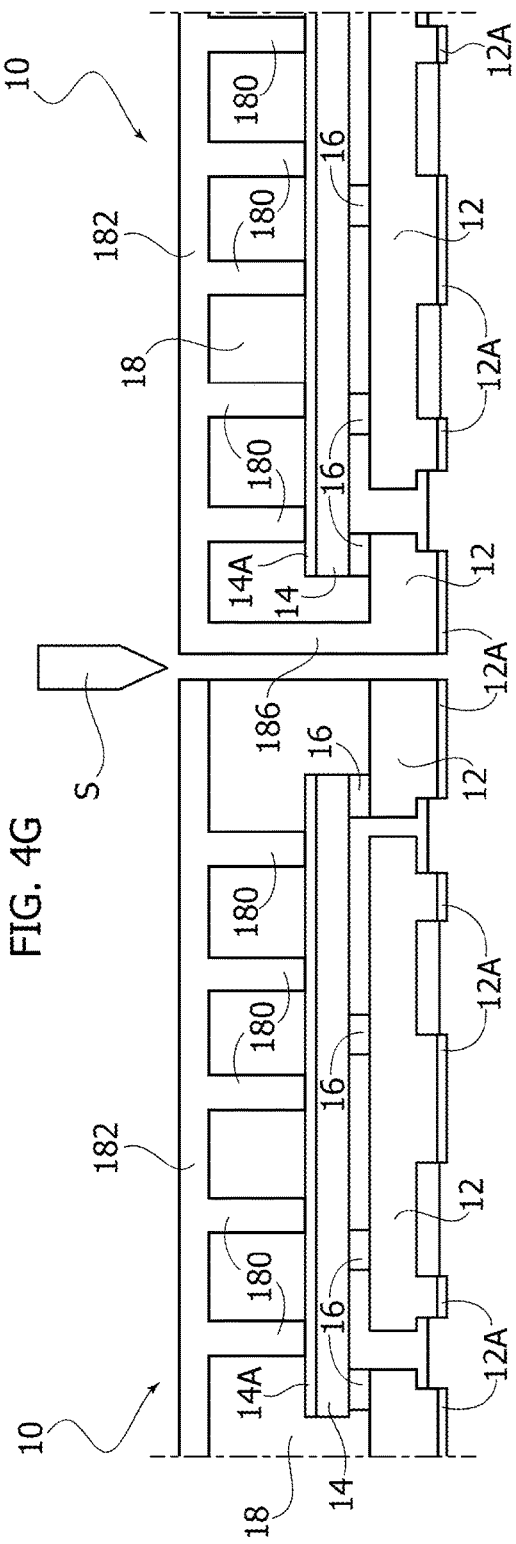

Merely by way of illustration, FIG. 4F (and FIG. 4G) represent: on the left side of the figure, the option illustrated in FIG. 2 (sacrificial vias 184 to be removed during a the final singulation step of FIG. 4G), and on the right side of the figure, the option illustrated in FIG. 3 (leads in the leadframe 12 used to connect through vias 186 the top exposed pad 182).

As noted, such a representation is merely by way of illustration, in so far as industrial assembly flows implemented on a certain strip of devices will expectedly apply either of these options.

FIG. 4G is exemplary of a final singulation step, performed in a conventional way via a sawing tool S, for instance, in order to partition such a strip into individual semiconductor devices 10.

Briefly, a method as exemplified herein may comprise: arranging on a leadframe (for instance, 12) at least one semiconductor chip or die (for instance, 14) having a first side facing towards the leadframe and electrically coupled therewith (for instance, via metal, e.g., copper pillars 16) and a second side facing away from the leadframe; molding an (insulating) encapsulation (for instance, 18) on the at least one semiconductor chip or die arranged on the leadframe, wherein the encapsulation has an outer surface opposite the leadframe and comprises laser direct structuring, LDS material; and applying laser direct structuring processing (for instance, LB, CP) to the LDS material of the encapsulation to provide at least one metal via (for instance, 180) between the outer surface of the encapsulation and the second side of the at least one semiconductor chip or die, and a metal pad (for instance, 182) at the outer surface of the encapsulation.

In a method as exemplified herein, laser direct structuring processing applied to the LDS material of the encapsulation may comprise: applying laser beam energy (for instance, LB) to the outer surface of the encapsulation in order to drill at least one laser-activated hole between the outer surface of the encapsulation and the second side of the at least one semiconductor chip or die and to provide laser activation of the outer surface of the encapsulation, and growing (for instance, CP) metal material in the at least one laser-activated hole to provide said at least one metal via between the outer surface of the encapsulation and the second side of the at least one semiconductor chip or die, and at the outer surface of the encapsulation to provide said metal pad at the outer surface of the encapsulation.

A method as exemplified herein may comprise forming a metallization (for instance, 14A) at the second side of the at least one semiconductor chip or die wherein the at least one metal via is (electrically and/or thermally) coupled to said metallization.

A method as exemplified herein may comprise electrically coupling the first side of the at least one semiconductor chip or die with the leadframe via metal pillars (for instance, 16).

A method as exemplified herein may comprise: applying laser direct structuring processing (LB, CP) to the LDS material of the encapsulation to provide at least one metal via (for instance, 184, 186) between the outer surface of the encapsulation and the leadframe, wherein said at least one metal via facilitates forming said metal pad at the outer surface of the encapsulation.

A method as exemplified herein may comprise: applying laser direct structuring processing to the LDS material of the encapsulation to provide at least one sacrificial metal via (for instance, 184) between the outer surface of the encapsulation and the leadframe, wherein the at least one sacrificial metal via facilitates forming said metal pad at the outer surface of the encapsulation, and removing (for instance, S) the at least one sacrificial metal via following formation of said metal pad at the outer surface of the encapsulation.

A device (for instance, 10) as exemplified herein may comprise: a leadframe (for instance, 12) having arranged thereon at least one semiconductor chip or die (for instance, 14) having a first side facing towards the leadframe and electrically coupled therewith (for instance, via pillars such as 16) and a second side facing away from the leadframe; an encapsulation (for instance, 18) molded on the at least one semiconductor chip or die arranged on the leadframe, wherein the encapsulation has an outer surface opposite the leadframe and comprises laser direct structuring, LDS material; at least one metal via (for instance, 180) formed in the LDS material of the encapsulation between the outer surface of the encapsulation and the second side of the at least one semiconductor chip or die; and a metal pad (for instance, 182) formed at the outer surface of the LDS material of the encapsulation.

A device as exemplified herein may comprise metal material grown: in at least one laser-activated hole drilled in the LDS material of the encapsulation to provide said at least one metal via between the outer surface of the encapsulation and the second side of the at least one semiconductor chip or die; and at the outer surface of the LDS material of the encapsulation to provide said metal pad at the outer surface of the encapsulation.

A device as exemplified herein may comprise a metallization (for instance, 14A) at the second side of the at least one semiconductor chip or die, wherein the at least one metal via is coupled (electrically and/or thermally) to said metallization.

A device as exemplified herein may comprise metal pillars (for instance, 16) electrically coupling the first side of the at least one semiconductor chip or die with the leadframe.

A device as exemplified herein may comprise at least one metal via (for instance, 186) formed in the LDS material of the encapsulation between the outer surface of the encapsulation and the leadframe.

It will be appreciated that sacrificial vias such as 184 will no longer be visible in individual devices 10 after singulation (see S in FIG. 4G).

Without prejudice to the underlying principles, the details and the embodiments may vary, even significantly, with respect to what has been described by way of example only without departing from the scope of the embodiments.

The invention claimed is:

1. A method, comprising:
    arranging, on a leadframe, at least one semiconductor die having a first side facing towards the leadframe and electrically coupled therewith and a second side facing away from the leadframe;
    molding an encapsulation on the at least one semiconductor die arranged on the leadframe, wherein the encapsulation has an outer surface opposite the leadframe and comprises laser direct structuring (LDS) material; and
    applying laser direct structuring processing to the LDS material of the encapsulation to provide:
        at least one metal via between the outer surface of the encapsulation and the second side of the at least one semiconductor die; and
        a metal pad at the outer surface of the encapsulation.

2. The method of claim 1, further comprising forming a metallization at the second side of the at least one semiconductor die wherein the at least one metal via is coupled to said metallization.

3. The method of claim 1, wherein the laser direct structuring processing applied to the LDS material of the encapsulation comprises:
    applying laser energy to the outer surface of the encapsulation in order to drill at least one laser-activated hole between the outer surface of the encapsulation and the second side of the at least one semiconductor die, and to provide laser activation of the outer surface of the encapsulation; and
    forming metal material:
        in the at least one laser-activated hole to provide said at least one metal via between the outer surface of the encapsulation and the second side of the at least one semiconductor die, and
        at the outer surface of the encapsulation to provide said metal pad at the outer surface of the encapsulation.

4. The method of claim 3, further comprising coupling the at least one metal via to a metallization formed on the second side of the at least one semiconductor die.

5. The method of claim 1, further comprising electrically coupling the first side of the at least one semiconductor die with the leadframe via metal pillars.

6. The method of claim 1, further comprising:
    applying laser direct structuring processing to the LDS material of the encapsulation to provide at least one metal via between the outer surface of the encapsulation and the leadframe, wherein said at least one metal via facilitates forming said metal pad at the outer surface of the encapsulation.

7. The method of claim 6, further comprising:
    applying laser direct structuring processing to the LDS material of the encapsulation to provide at least one sacrificial metal via between the outer surface of the encapsulation and the leadframe, wherein the at least one sacrificial metal via facilitates forming said metal pad at the outer surface of the encapsulation; and
    removing the at least one sacrificial metal via following formation of said metal pad at the outer surface of the encapsulation.

8. The method of claim 1, wherein the LDS material comprises a thermoplastic material doped with a laser activatable compound that forms electrically conductive formations at locations where the laser direct structuring processing was performed.

9. A method for forming thermal management structures on a semiconductor device, comprising:
    providing a semiconductor chip with a backside metallization;
    mounting the semiconductor chip on a pre-molded leadframe with the backside thereof facing away from the pre-molded leadframe;
    encapsulating the semiconductor chip and a portion of the leadframe with a laser direct structuring (LDS) molding compound;
    applying laser energy to structure a thermal pad on a top surface of the encapsulation; and
    forming metallized vias through the encapsulation to the backside metallization of the semiconductor chip; and
    adding a heat sink on top of the structured thermal pad.

10. The method of claim 9, further comprising:
    forming sacrificial metal vias; and
    later removing the sacrificial metal vias to facilitate formation of the metallized pad.

11. The method of claim 9, wherein applying the laser energy to structure the thermal pad further comprises applying the laser energy to activate selective areas of the LDS molding compound for subsequent metallization.

12. The method of claim 9, further comprising applying a layer of electroless copper followed by nickel and gold to activated areas of the LDS molding compound.

13. The method of claim 9, wherein the semiconductor chip is mounted on the leadframe using flip-chip technology, and metal bumps are used to electrically connect the backside metallization of the semiconductor chip to the leadframe.

* * * * *